United States Patent
Allendorf et al.

(10) Patent No.: US 9,711,743 B1
(45) Date of Patent: Jul. 18, 2017

(54) RECONFIGURABLE ELECTRONICS USING CONDUCTING METAL-ORGANIC FRAMEWORKS

(71) Applicant: National Technology & Engineering Solutions of Sandia, LLC, Albuquerque, NM (US)

(72) Inventors: Mark D. Allendorf, Pleasanton, CA (US); Albert Alec Talin, Dublin, CA (US); Francois Leonard, Brentwood, CA (US); Vitalie Stavila, Pleasanton, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 20 days.

(21) Appl. No.: 14/591,550

(22) Filed: Jan. 7, 2015

Related U.S. Application Data

(60) Provisional application No. 61/925,170, filed on Jan. 8, 2014.

(51) Int. Cl.
*H01L 51/00* (2006.01)
*H01L 51/05* (2006.01)

(52) U.S. Cl.
CPC ...... *H01L 51/0091* (2013.01); *H01L 51/0002* (2013.01); *H01L 51/0558* (2013.01)

(58) Field of Classification Search
CPC ................................................. G01N 27/4143
See application file for complete search history.

(56) References Cited

U.S. PATENT DOCUMENTS

| | | | | |
|---|---|---|---|---|
| 2011/0297558 A1* | 12/2011 | Hill | ........................ | B01D 53/02 206/0.7 |
| 2012/0077667 A1* | 3/2012 | Liu | ..................... | H01M 4/8605 502/101 |
| 2012/0282142 A1* | 11/2012 | Fleischer | ........... | G01N 27/4143 422/98 |
| 2013/0274087 A1* | 10/2013 | da Silva Pinto | ....... | B01D 53/02 502/4 |
| 2013/0280611 A1* | 10/2013 | Alkordi | ............... | H01M 2/1673 429/224 |

(Continued)

OTHER PUBLICATIONS

Tunable Electrical Conductivity in Metal Organic Framework Thin-film Devices, Science Express, Dec. 5, 2013.*

(Continued)

*Primary Examiner* — Caridad Everhart
*Assistant Examiner* — Ankush Singal
(74) *Attorney, Agent, or Firm* — Blakely, Sokoloff, Taylor & Zafman, LLP

(57) ABSTRACT

A device including a porous metal organic framework (MOF) disposed between two terminals, the device including a first state wherein the MOF is infiltrated by a guest species to form an electrical path between the terminals and a second state wherein the electrical conductivity of the MOF is less than the electrical conductivity in the first state. A method including switching a porous metal organic framework (MOF) between two terminals from a first state wherein a metal site in the MOF is infiltrated by a guest species that is capable of charge transfer to a second state wherein the MOF is less electrically conductive than in the first state.

19 Claims, 2 Drawing Sheets

(56) References Cited

U.S. PATENT DOCUMENTS

2015/0073164 A1* 3/2015 Nomura .................. C07C 45/38
556/115
2015/0283520 A1* 10/2015 Hill ........................ B01D 71/44
95/45

OTHER PUBLICATIONS

Metal-Organic Framework Materials as Chemical Sensors, Chemical Reviews, Nov. 9, 2011.*
Chua, E. K., et al., "Low resistance, high dynamic range reconfigurable phase change switch for radio frequency applications", American Institute of Physics. 97, (2010), 183506-1 to 183506-3.
Nakanishi, H., et al., "Dynamic internal gradients control and direct electric currents within nanostructured materials", Nature Nanotechnology, vol. 6., (2011), 740-746.
Silvi, S., et al., "Artificial molecular shuttles: from concepts to devices", J. Mater. Chem., 19, (2009), 2279-2294.
Xiong, F., et al., "Low-Power Switching of Phase-Change Materials with Carbon Nanotube Electrodes", Science, vol. 332, (Apr. 29, 2011), 568-570.

\* cited by examiner

RECONFIGURABLE ELECTRONICS USING CONDUCTING METAL-ORGANIC FRAMEWORKS

CROSS-REFERENCE TO RELATED APPLICATION

The application claims the benefit of the earlier filing date of U.S. Provisional Patent Application No. 61/925,170, filed Jan. 8, 2014, entitled "Reconfigurable Electronics Using Conducting Metal-Organic Frameworks." The aforementioned application is hereby incorporated by reference, in its entirety, for all purposes.

STATEMENT OF GOVERNMENT RIGHTS

This invention was developed under Contract DE-AC04-94AL85000 between Sandia Corporation and the U.S. Department of Energy. The U.S. Government has certain rights in this invention.

FIELD

Metal-organic frameworks and organic semiconductor devices and uses.

BACKGROUND

Metal-organic frameworks (MOFs) are crystalline materials with a nanoporous supramolecular structure consisting of metal ions connected by organic ligands. Their tailorable porosity, ease of synthesis, and ultra-high surface areas, combined with a broad choice of suitable building blocks make them promising materials for gas storage, chemical separation, catalysis, chemical sensing, and drug delivery. Unfortunately, MOFs are usually poor electrical conductors because of the insulating character of the organic ligands and the poor overlap between their π orbitals and the d orbitals of the metal ions. Combining the crystalline order of MOFs with an ability to conduct electrical charge has the potential to create a new class of materials that would open a suite of unique applications. While strategies to engineer electrically conducting MOFs have been proposed (e.g., using second- or third-row transition metals, redox-active linkers, and heterobimetallic structures), few of these approaches have been realized. Until recently only one example of an intrinsically conducting framework with permanent porosity was known: a p-type semiconducting MOF in which conductivity occurs via a redox mechanism. Very recently, Gandara et al. described a series of metal triazolate MOFs, one of which exhibits Ohmic conductivity. Although the mechanism of conductivity in that case is not known, it appears to be highly specific to the presence of divalent iron in the structure.

SUMMARY

In one embodiment, a device includes a porous metal organic framework (MOF) disposed between two terminals, the device comprising a first state wherein a metal site of the MOF is infiltrated by a guest species to form an electrical path between the terminals and a second state wherein the electrical conductivity of the MOF is less than the electrical conductivity in the first state. Representatively, in the second state, the MOF is free of the guest or the guest species is a first guest species and, in the second state, the first guest species is replaced with a second guest species.

In another embodiment, a method includes switching a MOF between two terminals from a first state wherein a metal site in the MOF is infiltrated by a guest species that is capable of charge transfer to a second state wherein the MOF is less electrically conductive than in the first state. Representatively, the switching comprises displacing the guest species or the guest species is a first guest species and switching comprises displacing the first guest species with a second guest species.

DETAILED DESCRIPTION

Figure 1:
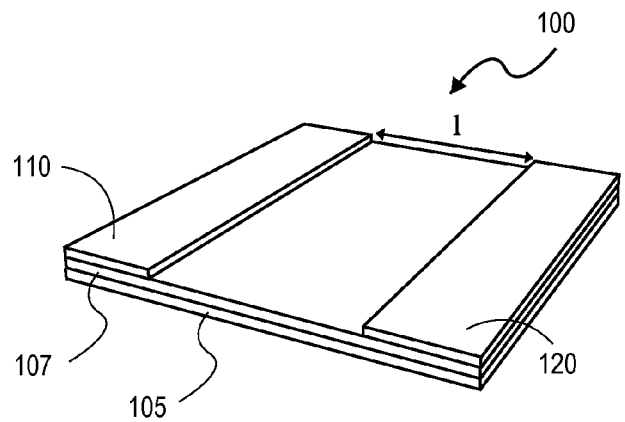
FIG. 1 shows a top perspective view of an embodiment of a thin film device including conductive pads separated on a substrate.

In one embodiment, a device is disclosed that is operable as a reconfigurable electronic switch based on an electrically conducting MOF. A method of operating such a device is also disclosed. The device includes a porous metal organic framework (MOF) disposed between two terminals. In a first state, a metal site of the MOF of the device is infiltrated by a guest species (e.g., a metal site of the MOF is coordinated by a guest species) to form an electrical path between the terminals and, in a second state, the electrical conductivity of the MOF is less than the electrical conductivity in the first state. By combining a MOF and a guest species that participates in charge transfer with the MOF, the MOF is electrically conductive. Positioning such a MOF in a device as, for example, a channel between to terminals, the device becomes reconfigurable switch based on the state of the MOF. The switch is on in a first state, wherein the MOF is coordinated by the guest species. Representatively, in the second state, the MOF is free of the guest species or the guest species is a first guest species and the first guest species is replaced with a second guest species.

Devices based on guest-infiltrated MOF films could be switched from conducting (ON) to insulating (OFF) by several means, including: rinsing with clean solvent to remove the bound guest species; exposure to a second molecule that displaces guest species; heating under vacuum or gas flow to remove a guest species; applied electric field; or light. A reconfigurable switch could also be implemented by modifying an existing species-based circuit by reversible binding of another species to the original species coordinated to the MOF or replacement of the original species with another species. Applications include, but are not limited to non-volatile resistance change devices, reconfigurable radio frequency (RF) circuits and sensors.

In one embodiment, a MOF is a compound including metal ions or clusters coordinated to organic ligands. Suitable metal ions or clusters include copper ions (e.g., $Cu^{2+}$), and ions of chromium (Cr), iron (Fe), nickel (Ni), molybdenum (Mo) and ruthenium (Ru). In one embodiment, a suitable MOF includes $Cu_3(BTC)_2$ also known as HKUST-1.

In one embodiment, a guest species that participates in charge transfer with the MOF includes a delocalized π electron or π electrons. Representative guest species include one or more nitrile moieties, one or more thiol moieties, one or more carbonyl moieties, one or more thiolate moieties, one or more amine moieties, one or more imine moieties, one or more hydroxyl moieties, or a mixture thereof. A moiety is used generally to identify a portion of a molecule. In one embodiment, the guest species is 7,7,8,8-tetracyanoquinododimethane (TCNQ), a molecule having multiple nitrile moieties. In one embodiment, a composition includes a porous MOF of $Cu_3(BTC)_2$ and a guest species of TCNQ. Without wishing to be bound by theory, it is believed the recited moieties of respective molecules participate in the charge transfer with the MOF and thus, are responsible for imparting electrical conductivity to the composition (MOF and guest species). In another embodiment, a representative guest species is a molecule that has a configuration that will interact with a MOF to impart electrical conductivity. Representative molecules include thiophenes, dithiophenes, tetrathiafulvalene, imidazole, triazole, tetrazole and derivatives and/or mixtures thereof. In a further embodiment, a representative guest species is a transition metal complex operable to undergo an outer sphere electron transfer. Examples include, but are not limited to, ruthenium hexamine, hexacyanoferrate and hexacyanocobaltrate. Such complexes can be assembled into bulk semiconducting coordination polymers operable to undergo a charge transfer reaction with an MOF resulting in conducting behavior.

Figure 2:
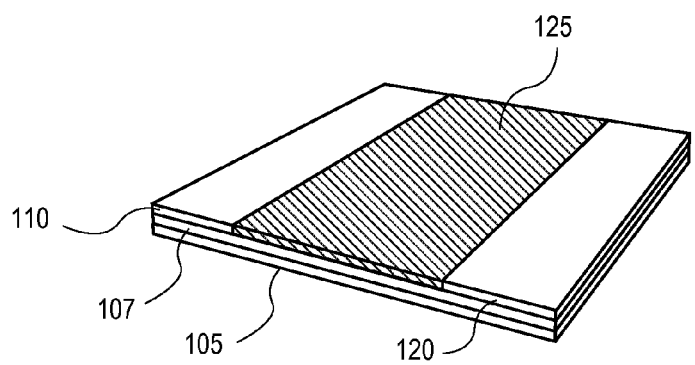
FIG. 2 shows the structure of FIG. 1 following the introduction of a porous MOF on a dielectric layer between the conductive pads.
Figure 3:
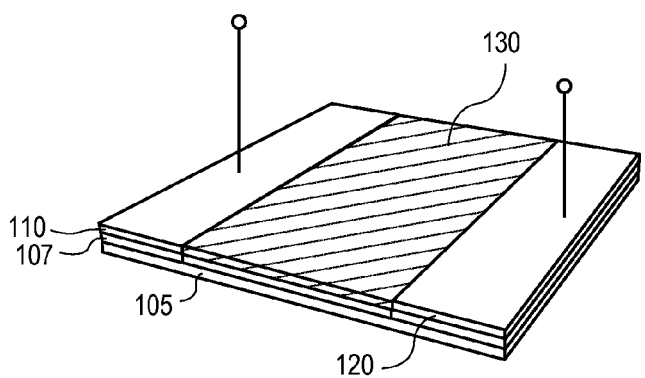
FIG. 3 shows the structure of FIG. 2 following the infiltration of the $Cu_3(BTC)_2$ MOF with a guest species.

FIGS. 1-3 illustrate a method of forming an electrically conductive MOF thin film devices on a substrate. Referring to FIG. 1, structure 100 includes substrate 105 that is, for example, a portion of a silicon wafer. In one embodiment, substrate 105 includes a device layer including a number of devices (e.g., transistor devices) and circuits (CMOS) established through metallization to the devices. Overlying a surface of substrate 105 (a top surface as viewed) is dielectric layer 107 of, for example, silicon dioxide that is grown on the substrate. In one embodiment, dielectric layer 107 has a thickness on the order of 100 nanometers (nm). As shown in FIG. 1, also disposed on substrate 105 and on dielectric layer 107 are two conductive pads separated by a channel length, l. Representative lengths for channel length, l, include 100 microns (μm), 150 μm and 200 μm. In one embodiment, conductive pad 110 and conductive pad 120, respectively, are each a metal material such as platinum (Pt). Representative dimensions of each of conductive pads 110 and 120 are 800 μm by 400 μm. A representative thickness of conductive pads 110 and 120 is 100 nm.

FIG. 2 shows structure 100 of FIG. 1 following the introduction of a porous MOF on dielectric layer 107 between conductive pad 110 and conductive pad 120. In one embodiment, porous MOF is a film of $Cu_3(BTC)_2$ conformally introduced on a surface of structure 100 dielectric layer 107. A representative nominal thickness of a film of a porous MOF is 100 nm. Representatively, a $Cu_3(BTC)_2$ film may be grown on dielectric layer 107 in a liquid cell reactor as described in the art. In one embodiment, a polycrystalline $Cu_3(BTC)_2 \cdot xH_2O$ film was grown with preferred orientation along the (111) direction. FIG. 2 shows MOF film 125 in a channel region or area of the structure between and in contact with conductive pad 110 and conductive pad 120. Current voltage (I-V) characteristics obtained for an as-grown thin film device indicate a very small conductivity ($\sim 10^{-6}$ S/m) is observed for film 125, consistent with the expected insulating nature of $Cu_3(BTC)_2$.

FIG. 3 shows the structure of FIG. 2 following the infiltration of the $Cu_3(BTC)_2$ MOF with a guest species. In one embodiment, MOF film 125 of $Cu_3(BTC)_2$ is infiltrated with a guest species of 7,7,8,8-tetracyanoquinododimethane (TCNQ) by heating in vacuum at 180° C. for 30 minutes to remove the water molecules, and then immediately transferring to a saturated $TCNQ/CH_2Cl_2$ solution for infiltration. FIG. 3 shows film 130 illustrative of an infiltrated MOF. A linear I-V curve for such a film indicates a conductivity of 7 S/m, nearly seven orders of magnitude larger than the un-infiltrated devices. Measurements as a function of channel length show a monotonic increase of resistance with increasing electrode separation (increasing l) thus indicating that contact resistance effects are not at the origin of the phenomenon. Further, the TCNQ-infiltrated devices are stable in ambient over a long period of time. The temperature dependence of the conductivity is also measured. The conductivity decreases with decreasing temperature and follows a thermally activated relation $\sigma \sim \exp(-E_a/T)$ with a low activation energy $E_a$ of 41±1 meV, similar to values reported for high mobility organic polymeric semiconductors such as poly-3-hexylthiophene (P3HT).

In one embodiment, as shown in FIG. 3, a thin film device as a switch is in the ON position in the sense that current can representatively flow from conductive pad 110 through film 130 (a channel) to conductive pad 120. TCNQ-MOF can be switched OFF by: 1) flushing the device with solvent to displace TCNQ; 2) by heating or exposing to vacuum to evaporate TCNQ; or 3) by exchanging TCNQ with a second molecule that coordinates to the open metal site, but does not coordinate in the same way as does TCNQ (an example would be a water molecule) or has electronic properties that do not enable charge transport (an example would be cyclohexane-(1,4-diylidene)dimalononitrile).

Figure 4:
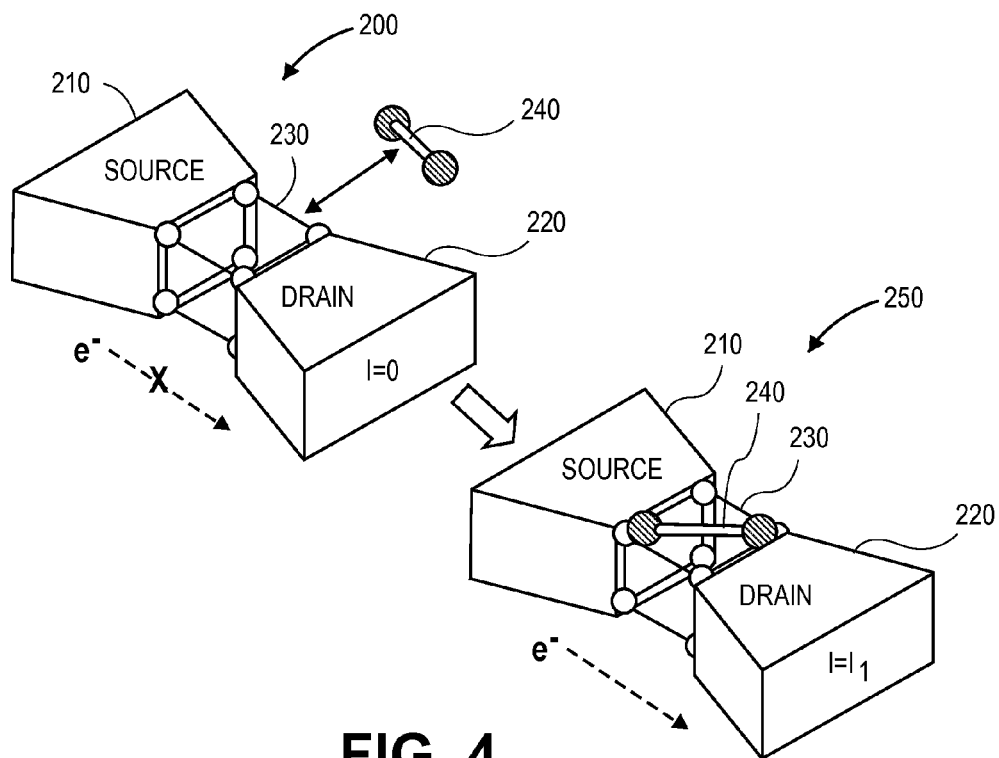
FIG. 4 shows a top perspective view of a switch including a reconfigurable MOF being switched from non-electrically conducting to electrically conducting by the infiltration of a guest species.
Figure 5:
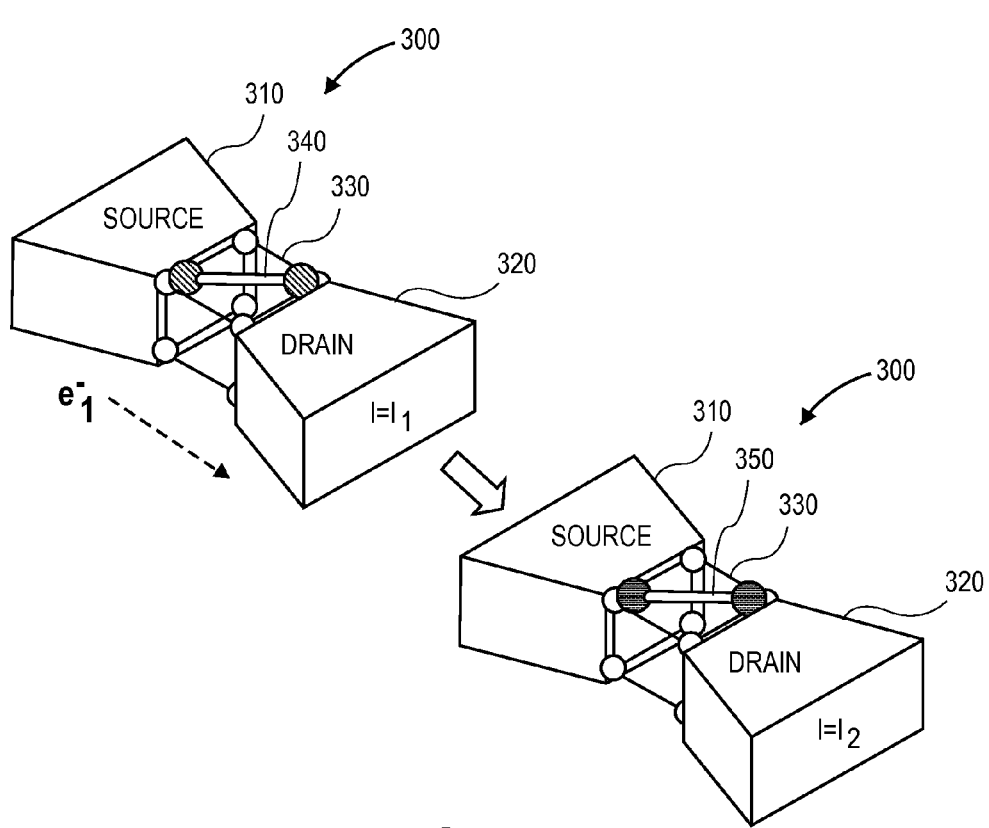
FIG. 5 shows a top perspective view of a switch being switched from a first state to a second state by a displacement of a first guest species in a MOF and infiltration by a second guest species.

FIG. 4 and FIG. 5 illustrate embodiments of reconfigurable switches. Referring to FIG. 4, switch 200 includes source region 210 and drain region 220 with MOF 230 therebetween. In one embodiment, MOF 230 is generally non-electrically conductive and has an open metal site to which a guest species can associate (e.g., bond). Prior to infiltration of the MOF by a guest species, the switch is in a first state in which a current does not flow. FIG. 4 shows guest species 240 infiltrating MOF 230 and rendering the MOF more electrically conductive. The switch is now in a second state including a conductive channel through which current, $I_1$, can flow. The HKUST-1 with an open metal site is a representative example for MOF 230 and TCNQ is an example of guest species 240.

FIG. 5 shows another embodiment where a switch includes a reconfigurable MOF and such MOF is electrically reconfigured by displacing a first guest species and replacing the displaced first guest species with a second guest species. In the illustrated embodiment in FIG. 5, switch 300 includes MOF 330 disposed between source 310 and drain 320. MOF 330 is infiltrated with first guest species 340 to render the switch electrically conductive (e.g., MOF 330 is HKUST-1 and first guest species 340 is TCNQ). A current, can flow through the device in this state (from source 310 to drain 320) (an "ON" state). FIG. 5 also shows switch 300 after first guest species 340 is displaced from MOF 330 and replaced with second guest species 350. In one embodiment, second guest species has a property such that when it is infiltrated in MOF 330, the MOF is less electrically conductive than when MOF 330 is infiltrated with first guest species 340. In one embodiment, a current, $I_2$, through switch 300 when MOF 330 is infiltrated with second guest species 350 is zero or close to zero ($I_2<I_1$). Examples of a second guest species that is operable to render MOF 330 less electrically conductive includes water and cyclohexane-(1,4-diylidene)dimalononitrile. In another embodiment, MOF 330 is more electrically conductive when infiltrated with second guest species 350 relative to when it is infiltrated with first guest species 340, so $I_2>I_1$. An example is a first guest (2,3,5,6-tetrafluoro-7,7,8,8-tetracyanoquinodimethane ($F_4$-TCNQ), and the second guest is TCNQ. $F_4$-TCNQ-HKUST-1 conducts but not as well as TCNQ-HKUST-1.

The properties of the TCNQ-infiltrated HKUST-1 films indicate that an electronic switch would have the following characteristics:

bistable switching, i.e., reversible transition from insulating to conducting forms;
energy efficient (no power consumption in either state);
low resistance, ohmic contacts;
high dynamic range (OFF-ON resistance ratio is $>10^6$);
low ON state resistance;
tunable conductivity (by modifying TCNQ or by controlling the TCNQ loading); and
stable in air.

While the above example used $Cu_3(BTC)_2$ or HKUST-1 as an electrically modifiable MOF (modifiable from a first conductive state to a second different conductive state), the approach is generalizable to other MOFs and other guest molecules. For example, it is anticipated that MOFs containing paddlewheel-type structures, such as the NOTT, rht and nbo MOFs as well as MOF-74 (including the extended versions) and other MOFs containing open metal sites, will exhibit conducting behaviors. Examples of other guest molecules include thiols, thiophenes, diimides, molecules with conjugated pi systems, selenium and tellurium compounds and nitric oxides.

In conclusion, the infiltration (incorporation) of guest molecules into MOFs can lead to a modification in the electrical conductivity of a film of the MOF while preserving the porous, crystalline structure. Such modification provides an opportunity for reconfigurable electronic applications such as switches, sensors (e.g., electrochemical sensors, chemiresistors, piezoresistors, impedance sensors, and field-effect transistors) non-volatile resistance change devices, and reconfigurable RF circuits.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A device comprising:
a porous metal organic framework (MOF) disposed between two terminals, the device comprising a first state wherein the MOF is infiltrated by a guest species to form an electrical path between the terminals and a second state wherein the electrical conductivity of the MOF is less than the electrical conductivity in the first state, wherein, in the second state, the MOF is free of the guest species.

2. A device comprising:
a porous metal organic framework (MOF) disposed between two terminals, the device comprising a first state wherein the MOF is infiltrated by a guest species to form an electrical path between the terminals and a second state wherein the electrical conductivity of the MOF is less than the electrical conductivity in the first state, wherein the guest species is a first guest species and, in the second state, the first guest species is replaced with a second guest species.

3. The device of claim 1, wherein the MOF comprises $Cu_3(BTC)_2$.

4. The device of claim 1, wherein the guest species is selected from the group consisting of 7,7,8,8-tetracyanoquinododimethane, a nitrile moiety, a thiol moiety, a carbonyl moiety, a thiolate moiety, an amine moiety, an imine moiety, a hydroxyl moiety, or a mixture thereof.

5. The device of claim 2, wherein the first guest species is selected from the group consisting of 7,7,8,8-tetracyanoquinododimethane, a nitrile moiety, a thiol moiety, a carbonyl moiety, a thiolate moiety, an amine moiety, an imine moiety, a hydroxyl moiety, or a mixture thereof.

6. The device of claim 2, wherein the MOF comprises $Cu_3(BTC)_2$.

7. The device of claim 1, wherein the guest species is selected from the group consisting of a thiophene, a dithiopene, a tetrathiafulvalene, an imidazole, a triazole, a tetrazole, or a derivative thereof or a transition metal complex operable to undergo an outer sphere electron transfer.

8. A method comprising:
switching a porous metal organic framework (MOF) between two terminals from a first state wherein a metal site in the MOF is infiltrated by a guest species that is capable of charge transfer to a second state wherein an electrical conductivity of the MOF is different than in the first state.

9. The method of claim 8, wherein switching comprises displacing the guest species.

10. The method of claim 9, wherein the guest species is a first guest species and switching comprises displacing the first guest species with a second guest species.

11. The method of claim 8, wherein the MOF comprises copper.

12. The method of claim 8, wherein the MOF comprises $Cu_3(BTC)_2$.

13. The method of claim 8, wherein the guest species comprises a nitrile moiety, a thiol moiety or a carbonyl moiety.

14. The method of claim 8, wherein the guest species comprises 7,7,8,8-tetracyanoquinododimethane.

15. The method of claim 8, wherein the guest species is selected from the group consisting of a nitrile moiety, a thiol moiety, a carbonyl moiety, a thiolate moiety, an amine moiety, an imine moiety, a hydroxyl moiety or a mixture thereof.

16. The method of claim 8, wherein the guest species is selected from the group consisting of a thiophene, a dithiopene, a tetrathiafulvalene, an imidazole, a triazole, a tetrazole, or a derivative thereof or a transition metal complex operable to undergo an outer sphere electron transfer.

17. The method of claim 8, wherein an electrical conductivity of the MOF in the second state is less than in the first state.

18. The method of claim 8, wherein an electrical conductivity of the MOF in the second state is greater than in the first state.

19. The device of claim 2, wherein the first guest species is selected from the group consisting of a thiophene, a dithiopene, a tetrathiafulvalene, an imidazole, a triazole, a tetrazole, or a derivative thereof or a transition metal complex operable to undergo an outer sphere electron transfer.

* * * * *